United States Patent
Miyakawa et al.

(10) Patent No.: US 7,261,840 B2
(45) Date of Patent: Aug. 28, 2007

(54) ELECTROCONDUCTIVE RESIN COMPOSITION

(75) Inventors: Takeshi Miyakawa, Isezaki (JP); Katsuhisa Ogita, Isezaki (JP); Masafumi Hiura, Isezaki (JP); Minoru Oda, Isezaki (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 349 days.

(21) Appl. No.: 10/495,656

(22) PCT Filed: Dec. 19, 2002

(86) PCT No.: PCT/JP02/13313

§ 371 (c)(1),
(2), (4) Date: May 17, 2004

(87) PCT Pub. No.: WO03/057779

PCT Pub. Date: Jul. 17, 2003

(65) Prior Publication Data

US 2005/0004303 A1    Jan. 6, 2005

(30) Foreign Application Priority Data

Jan. 7, 2002    (JP) .............................. 2002-000406

(51) Int. Cl.
    *H01B 1/24* (2006.01)
(52) U.S. Cl. .................. 252/511; 428/922; 361/679
(58) Field of Classification Search .......... 252/511; 428/922; 257/678; 361/679
    See application file for complete search history.

(56) References Cited

U.S. PATENT DOCUMENTS

| | | | |
|---|---|---|---|
| 5,322,874 A * | 6/1994 | Fujii et al. .................. 524/227 |
| 5,415,906 A | 5/1995 | Miyakawa et al. |
| 5,707,699 A | 1/1998 | Miyakawa et al. |
| 5,747,164 A | 5/1998 | Miyakawa et al. |
| 5,876,632 A | 3/1999 | Miyakawa et al. |
| 5,955,164 A * | 9/1999 | Miyakawa et al. ........ 428/36.8 |
| 6,485,832 B1 | 11/2002 | Kosugi et al. |
| 6,759,130 B2 | 7/2004 | Kosugi et al. |
| 2003/0036602 A1 * | 2/2003 | Adedeji et al. ............... 525/88 |

FOREIGN PATENT DOCUMENTS

| | | |
|---|---|---|
| CN | 1373153 A | 10/2002 |
| EP | 0 355 602 A2 | 2/1990 |
| EP | 0 562 179 A1 | 9/1993 |
| EP | 1125985 | 8/2001 |
| JP | 08-188710 | 7/1996 |
| JP | 08-337714 | 12/1996 |
| JP | 2002-256125 | 9/2002 |
| JP | 2002-355935 | 12/2002 |

OTHER PUBLICATIONS

U.S. Appl. No. 10/635,501, filed Aug. 7, 2003, Kosugi, et al.
U.S. Appl. No. 10/030,103, filed Jan. 17, 2002, Miyakawa, et al.
U.S. Appl. No. 10/030,160, filed Jan. 30, 2002, Miyakawa, et al.
U.S. Appl. No. 10/178,021, filed Jun. 24, 2002, Miyakawa, et al.
U.S. Appl. No. 10/296,937, filed Dec. 10, 2002, Fujimura, et al.
U.S. Appl. No. 10/343,308, filed Jan. 30, 2003, Oda, et al.
U.S. Appl. No. 10/495,656, filed May 17, 2004, Miyakawa, et al.
Patent Abstracts of Japan, JP 08-188710, Jul. 23, 1996 (reference previously filed in Japanese language on May 17, 2004).
Patent Abstracts of Japan, JP 08-337714, Dec. 24, 1996 (reference previously filed in Japanese language on May 17, 2004).

* cited by examiner

*Primary Examiner*—Mark Kopec
(74) *Attorney, Agent, or Firm*—Oblon, Spivak, McClelland, Maier & Neustadt, P.C.

(57) ABSTRACT

An electroconductive resin composition useful for packaging an electronic device, is provided, whereby a drawback that carbon black is likely to fall off from the surface of a molded product by abrasion, has been overcome. It is an electroconductive resin composition which comprises at least one thermoplastic resin selected from the group consisting of a polyphenylene ether resin, a polystyrenic resin and an ABS resin, and carbon black and which contains a styrene/butadiene/butylene/styrene block copolymer or a mixture of such a copolymer with an olefinic resin, and has a surface resistivity of from $10^2$ to $10^{10}$ Ω. Contamination of IC, etc., to be caused by falling off of carbon black, etc. by abrasion when contacted with IC, etc., can be substantially reduced.

10 Claims, No Drawings

ELECTROCONDUCTIVE RESIN COMPOSITION

TECHNICAL FIELD

The present invention relates to an electroconductive resin composition. The electroconductive resin composition is useful for e.g. packaging an electronic device.

BACKGROUND ART

As a container for packaging an electronic device such as IC, an injection tray, a vacuum-formed tray, a magazine or an embossed carrier tape may, for example, be mentioned. For such a container for packaging an electronic device, an electroconductive resin composition is used to prevent breakage of the accommodated IC or the like by abrasion between the electronic device and the container or by static electricity generated when a cover is peeled from the container.

As such an electroconductive resin composition, one comprising a thermoplastic resin and an electroconductive filler, is known. The electroconductive filler may, for example, be fine metal powder, carbon fiber or carbon black. Carbon black is most commonly used, since it can uniformly be dispersed by adjusting the kneading conditions, etc., and a constant surface resistivity can easily be obtained. As the thermoplastic resin, a polyvinyl chloride resin, a polypropylene resin, a polyethylene terephthalate resin, a polystyrenic resin or an ABS resin is employed. Further, as one having heat resistance at a temperature of at least 100° C., a polyphenylene ether resin or a polycarbonate resin may, for example, be used. Among these resins, a polyphenylene ether resin is superior for heat resistance, and for general purposes, a polystyrenic resin and an ABS resin are superior to other resins in that even if carbon black is incorporated in a large amount, there will be no substantial decrease in the flowability or moldability, and they are advantageous also from the viewpoint of costs.

Such containers for packaging electronic devices are disclosed, for example, in JP-A-2001-84834, JP-A-2000-34408, JP-A-2000-143891, JP-A-2000-119454, JP-A-11-335549, JP-A-11-256025, JP-A-11-80534, JP-A-11-10806, JP-A-10-329279, JP-A-10-329278, JP-A-10-329885, JP-A-10-309784, JP-A-09-265835, JP-A-09-245524, JP-A-09-174769, JP-A-09-76422, JP-A-09-76423, JP-A-09-76425, JP-A-09-76424, JP-A-08-337678, JP-A-08-283584, JP-A-08-199075, JP-A-08-199077, JP-A-08-198999 and JP-A-08-199076.

A molded product of a composition having a large amount of carbon black incorporated, has a drawback that carbon black is likely to fall off from the surface of the molded product by abrasion.

DISCLOSURE OF THE INVENTION

The present invention is to overcome such a drawback and to provide an electroconductive resin composition comprising at least one thermoplastic resin selected from the group consisting of a polyphenylene ether resin, a polystyrenic resin and an ABS resin, and carbon black, wherein a styrene/butadiene/butylene/styrene block copolymer or a mixture of an olefinic resin and a styrene/butadiene/butylene/styrene block copolymer, is incorporated to such an electroconductive resin composition, whereby contamination of IC or the like caused by falling off of carbon black or the like by abrasion when contacted with IC or the like, is remarkably reduced.

Namely, the present invention provides the following.

(1) An electroconductive resin composition which comprises (A) 100 parts by weight of at least one thermoplastic resin selected from the group consisting of a polyphenylene ether resin, a polystyrenic resin and an ABS resin and (B) from 5 to 50 parts by weight of carbon black, and, based on 100 parts by weight of the total amount of (A) and (B), (D) from 1 to 30 parts by weight of an olefinic resin and (C) from 0.2 to 10 parts by weight of a styrene/butadiene/butylene/styrene block copolymer, and which has a surface resistivity of from $10^2$ to $10^{10}$ Ω.

(2) An electroconductive resin composition which comprises (A) 100 parts by weight of at least one thermoplastic resin selected from the group consisting of a polyphenylene ether resin, a polystyrenic resin and an ABS resin and (B) from 5 to 50 parts by weight of carbon black, and, based on 100 parts by weight of the total amount of (A) and (B), (C) from 1 to 30 parts by weight of a styrene/butadiene/butylene/styrene block copolymer, and which has a surface resistivity of from $10^2$ to $10^{10}$ Ω.

(3) The electroconductive resin composition according to the above (1), wherein (D) the olefinic resin is a polyethylene resin.

(4) A container for packaging an electronic device, which employs the electroconductive resin composition as defined in any one of the above (1) to (3).

(5) An electronic device package which employs the container for packaging an electronic device as defined in the above (4).

(6) A sheet which employs the electroconductive resin composition as defined in any one of the above (1) to (3).

(7) The sheet as defined in the above (6), which has a multilayer structure.

(8) The sheet as defined in the above (7), which has a substrate layer and a layer of the electroconductive resin composition.

(9) The container for packaging an electronic device, which employs the sheet as defined in any one of the above (6) to (8).

(10) An electronic device package which employs the sheet as defined in any one of the above (6) to (8).

BEST MODE FOR CARRYING OUT THE INVENTION

Now, the present invention will be described in further detail.

In the present invention, (A) at least one thermoplastic resin selected from the group consisting of a polyphenylene ether resin, a polystyrenic resin and an ABS resin, is used.

In the present invention, the polyphenylene ether resin is a resin containing a polyphenylene ether resin, or such a polyphenylene ether resin and a polystyrenic resin, as the main component. In the latter case, the polyphenylene ether resin is incorporated in an amount of from 28 to 86 wt %, particularly preferably from 40 to 80 wt %, based on the total amount of the polyphenylene ether resin and the polystyrenic resin. If it is less than 28 wt %, no adequate mechanical properties can be obtained as a polyphenylene ether resin, and if it exceeds 86 wt %, the molding tends to be difficult due to a decrease in the flowability. As such a polyphenylene ether resin, a homopolymer or a copolymer as disclosed in U.S. Pat. No. 3,383,435, may, for example, be mentioned.

In the present invention, the polystyrenic resin is a common polystyrene resin, an impact resistant polystyrene resin or one containing a mixture thereof as the main component.

The ABS resin is one containing a copolymer composed mainly of three components of acrylonitrile/butadiene/styrene, as the main component.

In the present invention, (B) carbon black is, for example, furnace black, channel black or acetylene black, preferably one having a large specific surface area, whereby a high level of electroconductivity can be obtained in a small amount of incorporation to the resin. For example, S.C.F. (Super Conductive Furnace), E.C.F. (Electric Conductive Furnace), Ketjenblack (tradename, manufactured by LION-AKZO K.K.) or acetylene black, may be mentioned. It is added in an amount such that the surface resistivity can be made to be from $10^2$ to $10^{10}$ Ω, preferably from $10^4$ to $10^8$ Ω. If the surface resistivity exceeds $10^{10}$ Ω, no adequate antistatic effect can be obtained, and if it is less than $10^2$ Ω, inflow of electricity from outside by e.g. static electricity will be facilitated, whereby an electronic device is likely to be broken.

In order to obtain the above surface resistivity, the amount of carbon black to be added, is specifically such that per 100 parts by weight of (A) the thermoplastic resin, (B) carbon black is preferably from 5 to 50 parts by weight, particularly preferably from 7 to 40 parts by weight. If the amount is less than 5 parts by weight, no adequate electroconductivity can be obtained, and the surface resistivity tends to be high, and if it exceeds 50 parts by weight, uniform dispersibility with the resin tends to deteriorate, the molding property tends to remarkably decrease, and the characteristic value such as the mechanical strength tends to be low.

In the present invention, (C) the styrene/butadiene/butylene/styrene block copolymer is a copolymer having the following chemical structure.

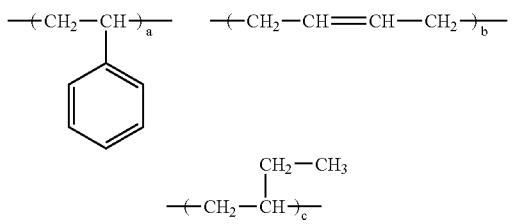

So long as it has the above structure, the method for its production is not particularly limited. For example, production methods are reported in "Structure and Performance of Novel Styrene Type Thermoplastic Elastomer (SBBS)" (Shuji Sakae et al, the 9th Polymer Material Forum, p. 125-126, 2000), JP-A-64-38402, JP-A-60-220147, JP-A-63-5402, JP-A-63-4841, JP-A-61-33132, JP-A-63-5401, JP-A-61-28507 and JP-A-61-57524. A commercial product of (C) the styrene/butadiene/butylene/styrene block copolymer may be used as it is.

In the present invention, when the electroconductive resin composition contains (A) at least one thermoplastic resin selected from the group consisting of a polyphenylene ether resin, a polystyrenic resin and an ABS resin, (B) carbon black and (C) a styrene/butadiene/butylene/styrene block copolymer, but does not contain (D) an olefinic resin, the amount of (C) the styrene/butadiene/butylene/styrene block copolymer is preferably from 1 to 30 parts by weight, more preferably from 3 to 25 parts by weight, per 100 parts by weight of the total amount of (A) the thermoplastic resin and (B) carbon black. If the amount is less than 1 part by weight, its effects tend to be inadequate, and if it exceeds 30 parts by weight, it tends to be difficult to uniformly disperse it in the polyphenylene ether resin, the polystyrenic resin or the ABS resin.

In the present invention, when the electroconductive resin composition comprises (A) at least one thermoplastic resin selected from the group consisting of a polyphenylene ether resin, a polystyrenic resin or an ABS resin, (B) carbon black, (D) an olefinic resin and (C) a styrene/butadiene/butylene/styrene block copolymer, the amount of (C) the styrene/butadiene/butylene/styrene block copolymer is such that per 100 parts by weight of the total amount of (A) the thermoplastic resin and (B) carbon black, the amount of (C) the styrene/butadiene/butylene/styrene block copolymer is from 0.2 to 10 parts by weight.

In the present invention, (D) the olefinic resin may, for example, be a homopolymer of ethylene or propylene, a copolymer of ethylene or propylene as the main component, for example, an ethylene/vinyl acetate copolymer, an ethylene/ethyl acrylate copolymer, an ethylene/α-olefin copolymer, or a blend product thereof. Among them, it is particularly preferred to use a polyethylene resin represented by a low density polyethylene resin, a high density polyethylene resin or a straight chain low density polyethylene resin. The melt flow index of (D) the olefinic resin is preferably at least 0.1 g/10 min at 190° C. under a load of 2.16 kg (measured in accordance with JIS K-7210). The amount of (D) the olefinic resin is preferably from 1 to 30 parts by weight, more preferably from 3 to 25 parts by weight, per 100 parts by weight of the total amount of (A) the thermoplastic resin and (B) carbon black. If the amount is less than 1 part by weight, its effects tend to be inadequate, and if it exceeds 30 parts by weight, it tends to be difficult to uniformly disperse it in an polyphenylene ether resin, a polystyrenic resin or an ABS resin.

In a case where carbon black is incorporated to bring the surface resistivity to a level of from $10^2$ to $10^{10}$ Ω in order for the electroconductive resin composition of the present invention to maintain sufficient moldability, the melt flow index (as measured in accordance with JIS K-7210) is preferably at least 0.1 g/10 min, particularly preferably at least 0.5 g/10 min under conditions of 230° C. and a load of 10 kg in the case of a polyphenylene ether resin, under conditions of 200° C. and a load of 5 kg in the case of a polystyrenic resin or under conditions of 220° C. and a load of 10 kg in the case of an ABS resin.

In order to improve the flowability of the composition or the mechanical properties of its molded product, it is possible to incorporate various additives such as a lubricant, a plasticizer, a processing adjuvant and a reinforcing agent, or other resin components, to the electroconductive resin composition, as the case requires.

In the present invention, in order to have the raw materials kneaded and pelletized to obtain the electroconductive resin composition, a known method by means of a Banbury mixer, an extruder or the like, may be employed. At the time of kneading, it is possible to knead the raw materials all at once, or it is possible to knead them stepwisely in such a manner that for example, a mixture of a styrenic resin and carbon black, and a mixture of a styrenic resin and a block copolymer, are separately kneaded, and the kneaded mixtures are finally kneaded all at once.

The electroconductive resin composition can be molded and thus used as a container for packaging an electronic device. The container for packaging an electronic device is a packaging container for an electronic device. For example, by means of a conventional method such as injection molding of the composition, or vacuum molding, blow molding, hot plate molding or the like of the composition molded into a sheet shape, it can be formed into a container for packaging an electronic device, such as a tray, a magazine tube or a carrier tape (an embossed carrier tape). It is particularly suitably employed as a carrier tape or a tray. By accommodating an electronic device in the container for packaging an electronic device, an electronic device package is obtained. In such a case, the container may have a covering, as the case requires. For example, in the case of a carrier tape, after an electronic device is accommodated, a cover is applied by a cover tape. The electronic device package includes one having such a structure.

The sheet of the electroconductive resin composition of the present invention may be a single layer sheet or a multilayer sheet. The multilayer sheet is one having a layer of the above electroconductive resin composition at least on one side of a substrate layer of a thermoplastic resin. The thermoplastic resin is not particularly limited. For example, a polyphenylene ether resin, a polystyrenic resin, an ABS resin or a polycarbonate resin may be used. The thickness of the sheet is usually from 0.1 to 3.0 mm, and in the multilayer sheet, the thickness of the layer of the electroconductive resin composition is preferably from 2 to 80% of the entire thickness.

The electronic device is not particularly limited, and it may, for example, be IC, a resistance, a capacitor, an inductor, a transistor, a diode, LED (light emitting diode), a liquid crystal, a piezoelectric element resistor, a filter, a crystal oscillator, a quartz resonator, a connector, a switch, a volume or a relay. The type of IC is not particularly limited, and it may, for example, be SOP, HEMT, SQFP, BGA, CSP, SOJ, QFP or PLCC.

Now, the present invention will be described in further detail with reference to Examples.

EXAMPLES 1 TO 5

The raw materials in the proportions as identified in Table 1, were uniformly mixed by a high speed mixer, then kneaded by means of a φ45 mm vented twin screw extruder and pelletized by a strand cut method. Then, the pelletized resin composition was formed into a sheet having a thickness of 300 μm by means of a φ65 mm extruder (L/D=28) and a T-die.

COMPARATIVE EXAMPLES 1 TO 5

The operation was carried out in the same manner as in Example 1 except that the raw materials were in the proportions as identified in Table 1. Evaluations were carried out by the following methods.

(1) Surface Resistivity

The resistivity was measured at optional ten points in a sample by means of a LORESTA surface resistance meter (manufactured by Mitsubishi Petrochemical Co., Ltd.) with an electrode gap being 10 mm.

(2) Falling off of Carbon

A frame of 20 mm×30 mm was attached to each sheet, and IC i.e. QFP14 mm×20 mm×64 pin was inserted therein, followed by reciprocation for 200,000 times with a stroke of 20 mm. Then, the presence or absence of a black colored deposition of carbon black, etc. on the lead portion of the above IC, was inspected by a microscope. Evaluation was made with respect to four pieces of IC in accordance with the following standards for six grades, and the total was taken as the result.

1: Deposition is observed over the entire portion of the lead which was in contact with the sheet.
2: Deposition is observed over the entire lead.
3: Deposition is observed on 21 to 63 pieces.
4: Deposition is observed on not more than 20 leads.
5: No deposition is observed.

(3) Tear Strength

Evaluation was carried out in accordance with JIS 7128-3.

(4) Du Pont Impact

Evaluation was carried out in accordance with ASTM D-2794.

(5) Folding Endurance

In accordance with JIS P-8115, evaluation was carried out at a folding angle of 135° under a load of 500 g at a speed of 175 rpm.

(6) Tensile Elongation, Tensile Strength at Yield Point, Tensile Strength at Break and Tensile Modulus In accordance with JIS-7127, evaluation was carried out at a tensile speed of 10 mm/min using a No. 4 test specimen.

TABLE 1

| | Composition (parts by weight) | | | | | | | | | |
|---|---|---|---|---|---|---|---|---|---|---|
| | (A) | Carbon black(B) | | | Olefinic resin (C) | | SEBS | | (D) | |
| | HIPS | A | B | (A) + (B) | EEA | HDPE | A | B | SBBS | SBR |
| Example 1 | 100 | 31.6 | | 100 | | 26.7 | | | 6.7 | |
| Example 2 | 100 | 28.6 | | 100 | | 19.8 | | | 3.7 | |
| Example 3 | 100 | 28.6 | | 100 | | 19.8 | | | 3.7 | |
| Example 4 | 100 | 30.0 | | 100 | 12.8 | 10.3 | 2.6 | | 2.6 | |
| Example 5 | 100 | 30.0 | | 100 | 12.8 | 10.3 | | 2.6 | 2.6 | |
| Comparative Example 1 | 100 | 27.6 | | 100 | 12.0 | 7.2 | | | | 0.9 |
| Comparative Example 2 | 100 | 26.5 | | 100 | 7.6 | | | | | 6.4 |
| Comparative Example 3 | 100 | | 26.5 | 100 | 7.6 | | | | | 6.4 |
| Comparative Example 4 | 100 | | 23.5 | 100 | 7.7 | | | | | 6.5 |
| Comparative Example 5 | 100 | | 24.5 | 100 | 12.3 | 7.4 | | | | 0.9 |

TABLE 2

|  | Thickness (μm) | Surface resistivity (Ω) | Tear strength (N/mm) MD | Tear strength (N/mm) TD | Du Pont impact (J) | Folding endurance (times) MD | Folding endurance (times) TD | Falling off of carbon (perfect score: 20 points) 200,000 times | Falling off of carbon (perfect score: 20 points) 400,000 times |
|---|---|---|---|---|---|---|---|---|---|
| Example 1 | 321 | $5.51 \times 10^2$ | 84.0 | 73.5 | 0.795 | 314 | 459 | 11 | 11 |
| Example 2 | 321 | $3.79 \times 10^2$ | 80.1 | 73.1 | 0.795 | 622 | 492 | 13 | 12 |
| Example 3 | 318 | $3.92 \times 10^2$ | 73.7 | 66.9 | 0.736 | 377 | 358 | 12 | 11 |
| Example 4 | 325 | $4.64 \times 10^2$ | 78.5 | 71.4 | 0.883 | 1389 | 925 | 11 | 11 |
| Example 5 | 313 | $4.52 \times 10^2$ | 80.2 | 70.5 | 0.868 | 1069 | 756 | 13 | 11 |
| Comparative Example 1 | 325 | $4.10 \times 10^2$ | 74.6 | 62.3 | 0.559 | 307 | 260 | 11 | 10 |
| Comparative Example 2 | 313 | $4.71 \times 10^2$ | 72.6 | 72.0 | 0.383 | 67 | 175 | 11 | 10 |
| Comparative Example 3 | 310 | $2.17 \times 10^2$ | 59.1 | 56.7 | 0.280 | 1 | 2 | 8 | 8 |
| Comparative Example 4 | 306 | $3.56 \times 10^2$ | 69.1 | 67.4 | 0.441 | 7 | 15 | 9 | 9 |
| Comparative Example 5 | 311 | $2.34 \times 10^2$ | 70.4 | 54.5 | 0.456 | 17 | 9 | 11 | 9 |

As shown in Table 2, each of Examples 1 to 5 is superior to Comparative Examples 1 to 5 in the teat strength, the Du Pont impact, the folding endurance and the falling off of carbon.

Using the electroconductive resin composition of Example 1 and an ABS resin as a substrate layer, a sheet having a layer of the conductive resin composition laminated in a thickness of 30 μm on each side of the substrate layer in a total thickness of 300 μm, was prepared by a feed block method by means of a ɸ65 mm extruder and two ɸ40 mm extruders. This multilayer sheet was formed into a carrier tape by a heat molding method wherein the sheet was heated in contact with a heater plate, followed by blow molding, and the carrier tape was suitable for packaging IC.

The resins used in Examples and Comparative Examples were as follows.

HIPS (impact resistant polystyrene resin): Toyo Styrol HI-E4 (manufactured Toyo Styrene K.K.)
Carbon Black A: Denka black granule (manufactured by Denki Kagaku Kogyo K.K.)
Carbon Black B: Vulcan black XC-72 (manufactured by Cabot)
EEA (ethylene/ethyl acrylate resin): NUC copolymer DPDJ-6169 (manufactured by Nippon Unicar K.K.)
PS/PE (polystyrene resin/polyethylene resin alloy): WS-2776 (manufactured by BASF)
HDPE (high density polyethylene resin): HI-ZEX 5000H (manufactured Mitsui Chemicals Inc.)
SEBS (hydrogenated styrene/butadiene copolymer resin) A: Tuftec H-1052 (manufactured by Asahi Kasei Corporation)
SEBS (hydrogenated styrene/butadiene copolymer resin ) B: Tuftec H-1062 (manufactured by Asahi Kasei Corporation)
SBBS (styrene/butadiene/butylene/styrene block copolymer resin): JT-82 (manufactured by Asahi Kasei Corporation, styrene content: 76.7 wt %, butadiene content: 11.7 wt % and butylene content: 11.6 wt %, by 1H-NMR spectrum integral values)

SBR (styrene/butadiene copolymer resin): DENKA STR1250 (manufactured by Denki Kagaku Kogyo K.K.)

EXAMPLES 6 AND 7

The raw materials in the proportions as identified in Table 3, were uniformly mixed by a high speed mixer, then kneaded by means of a ɸ45 mm vented twin screw extruder and pelletized by a strand cut method. Then, the pelletized resin composition was formed into a sheet having a thickness of 300 μm by means of a ɸ65 mm extruder (L/D=28) and a T-die.

COMPARATIVE EXAMPLE 6

The operation was carried out in the same manner as in Example 6 except that the raw materials were in the proportions as identified in Table 3.

TABLE 3

|  | Example 6 | Example 7 | Comparative Example 6 |
|---|---|---|---|
| HI-E4 | 74 | 76 | 60 |
| DPDJ-6169 |  |  | 10 |
| WS-2776 |  |  | 12 |
| JT-83 | 8 | 6 |  |
| Denka Black granule | 18 | 18 | 18 |

TABLE 4

| | Surface resistivity ($\Omega$) | | Elongation at break (%) | | Tensile strength at yield point (Mpa) | | Tensile strength at break (Mpa) | | Tensile modulus (Mpa) | | Falling off of carbon (perfect score: 20 points) |
|---|---|---|---|---|---|---|---|---|---|---|---|
| | Front surface | Rear surface | MD | TD | MD | TD | MD | TD | MD | TD | |
| Example 1 | $1.14 \times 10^3$ | $1.11 \times 10^3$ | 2.5 | 2.7 | — | — | 27.2 | 27.3 | 1825 | 1796 | 6 |
| Example 2 | $1.04 \times 10^3$ | $1.04 \times 10^3$ | 2.8 | 2.5 | — | — | 27.5 | 27.6 | 1840 | 1868 | 12 |
| Comparative Example 1 | $1.49 \times 10^3$ | $2.09 \times 10^3$ | 11.5 | 4.7 | 21.8 | 17 | 17.6 | 17.9 | 1185 | 1123 | 15 |

Each of Examples 6 and 7 is superior to Comparative Example 6 in the strength at break and the falling off of carbon. Using the electroconductive resin composition of Example 6 and an ABS resin for a substrate layer, a sheet having a layer of the electroconductive resin composition laminated in a thickness of 30 μm on each side of the substrate layer in a total thickness of 300 μm, was prepared by a feed block method by means of a φ65 mm extruder and two φ40 mm extruders. This multilayer sheet was formed into a carrier tape by a heat molding method wherein the sheet was heated in contact with a heater plate, followed by blow molding, and the carrier tape was suitable for packaging IC.

INDUSTRIAL APPLICABILITY

The electroconductive resin composition of the present invention, which comprises (A) 100 parts by weight of at least one thermoplastic resin selected from the group consisting of a polyphenylene ether resin, a polystyrenic resin and an ABS resin and (B) from 5 to 50 parts by weight of carbon black, and, based on 100 parts by weight of the total amount of (A) and (B), (D) from 1 to 30 parts by weight of an olefinic resin, or (D) from 1 to 30 parts by weight of an olefinic resin and (C) from 0.2 to 10 parts by weight of a styrene/butadiene/butylene/styrene block copolymer, and which has a surface resistivity of from $10^2$ to $10^{10}$ $\Omega$, is capable of remarkably reducing contamination due to falling off of carbon black by abrasion when contacted with an electronic device such as IC, and it is excellent in tensile strength. Especially when it contains (D) the olefinic resin and (C) the styrene/butadiene/butylene/styrene block copolymer, it is excellent also in the Du Pont impact and the folding endurance.

The invention claimed is:

1. An electroconductive resin composition which comprises (A) 100 parts by weight of at least one thermoplastic resin selected from the group consisting of a polyphenylene ether resin, a polystyrenic resin and an ABS resin and (B) from 5 to 50 parts by weight of carbon black, and, based on 100 parts by weight of the total amount of (A) and (B), (C) from 1 to 30 parts by weight of a styrene/butadiene/butylene/styrene block copolymer, and which has a surface resistivity of from $10^2$ to $10^{10}$ $\Omega$.

2. An electroconductive resin composition which comprises (A) 100 parts by weight of at least one thermoplastic resin selected from the group consisting of a polyphenylene ether resin, a polystyrenic resin and an ABS resin and (B) from 5 to 50 parts by weight of carbon black, and, based on 100 parts by weight of the total amount of (A) and (B), (D) from 1 to 30 parts by weight of an olefinic resin and (C) from 0.2 to 10 parts by weight of a styrene/butadiene/butylene/styrene block copolymer, and which has a surface resistivity of from $10^2$ to $10^{10}$ $\Omega$.

3. The electroconductive resin composition according to claim 2, wherein (D) the olefinic resin is a polyethylene resin.

4. A container for packaging an electronic device, which employs the electroconductive resin composition as defined in claim 2.

5. An electronic device package which employs the container for packaging an electronic device as defined in claim 4.

6. A sheet which employs the electroconductive resin composition as defined in claim 2.

7. The sheet as defined in claim 6, which has a multilayer structure.

8. The sheet as defined in claim 7, which has a substrate layer and a layer of the electroconductive resin composition.

9. The container for packaging an electronic device, which employs the sheet as defined in claim 6.

10. An electronic device package which employs the sheet as defined in claim 6.

* * * * *